United States Patent [19]
Ahonen et al.

[11] Patent Number: 5,243,281
[45] Date of Patent: Sep. 7, 1993

[54] MULTI-CHANNEL MAGNETIC FLUX DETECTOR COMPRISING A MAGNETOMETER MODULAR CONSTRUCTION IN A VESSEL CONTAINING A COOLING MEDIUM

[75] Inventors: Antti I. Ahonen; Jukka E. T. Knuutila; Juha T. A. Simola; Visa A. Vilkman, all of Helsinki, Finland

[73] Assignee: Neuromag Oy, Finland

[21] Appl. No.: 807,149

[22] Filed: Dec. 13, 1991

[30] Foreign Application Priority Data

Dec. 21, 1990 [FI] Finland .................................. 906340

[51] Int. Cl.$^5$ ........................................... G01R 33/035
[52] U.S. Cl. ..................................... 324/248; 324/262; 505/846; 128/653.1
[58] Field of Search ............... 324/248, 201, 204, 244, 324/260–262, 301, 302; 505/842–846; 128/731, 733, 630, 640, 644, 653; 307/306

[56] References Cited

U.S. PATENT DOCUMENTS

| | | | |
|---|---|---|---|
| 4,613,816 | 9/1986 | Zeamer | 324/248 |
| 4,761,611 | 8/1988 | Hoenig | 324/248 |
| 4,793,355 | 12/1988 | Crum et al. | 324/201 X |
| 4,827,217 | 5/1989 | Paulson | 324/248 |
| 4,977,896 | 12/1990 | Robinson et al. | 324/248 X |
| 5,061,680 | 10/1991 | Paulson et al. | 324/248 X |

FOREIGN PATENT DOCUMENTS

| | | |
|---|---|---|
| 111827 | 4/1987 | European Pat. Off. . |
| 361137 | 4/1990 | European Pat. Off. . |
| 3515199 | 11/1985 | Fed. Rep. of Germany . |
| 3515237 | 4/1986 | Fed. Rep. of Germany . |
| 63-111482 | 5/1988 | Japan .................................. 324/248 |

OTHER PUBLICATIONS

Clarke, "Squid's brains and gravity waves", *Physics Today*, Mar. 1986, pp. 36–44.
Angell et al, "Silicon Micromechanical Devices", *Scientific American*, Apr. 1983, pp. 44–55, vol. 248, No. 4.
R. Hari et al, "Cerebral Magnetic Fields", CRC Critical Reviews in Biomedical Engineering, vol. 14, 1986, pp. 93–126.
T. Ryhänen et al, "SQUID Magnetometers for Low-Frequency Applications", Journal of Low Temperature Physics, vol. 76, Sep. 1989, pp. 287–386.
J. Knuutila et al, "A Large-Area Low-Noise Seven--Channel DC SQUID Magnetometer for Brain Research", Rev of Scien. Instr., vol. 58, Nov. 1987, 2145–2156.
F. Wellstood et al, "Integrated Dc SQUID Magnetometer with a High Slew Rate", Rev. of Scientific Instruments, vol. 55, Jun. 1984, pp. 952–957.
J. Knuutila et al, "Design Considerations for Multichannel SQUID Magnetometes", Supercond. Quant. Inter. Dev. and Their Appln., 1985, pp. 939–944.
D. Drung et al, "Low-Noise High-Speed Dc Superconducting Quantum Interference Device Magnetometer . . . ", Applied Physics Letters, pp. 406–408, Jul. 1990.

*Primary Examiner*—Gerard R. Strecker
*Assistant Examiner*—Warren S. Edmonds
*Attorney, Agent, or Firm*—Andrus, Sceales, Starke & Sawall

[57] ABSTRACT

A superconducting device for measuring weak magnetic fields, especially those generated by the human brain and detected simultaneously over the whole skull. The superconducting magnetometer or gradiometer elements of the device are attached with connectors to a cross-connection/support element which, in turn, is attached to a connecting element containing the electric components necessary for connecting the SQUIDs to the room temperature electronics. The connecting element is attached to a neck plug for the dewar flask. The neck plug is made of a stiff thermal insulation to prevent convection and a ribbon cable containing parallel twisted pairs. The latter element is self-supporting and forms an integral part of the magnetometer support structure. The cables in the neck plug have been made out of wires having a relatively high resistance in order to minimize the heat leak between room temperature and the cryogenic environment of the magnetometers. The excess noise caused by the resistive leads may be compensated by increasing the SQUID gain using positive feedback.

10 Claims, 4 Drawing Sheets

MULTI-CHANNEL MAGNETIC FLUX DETECTOR COMPRISING A MAGNETOMETER MODULAR CONSTRUCTION IN A VESSEL CONTAINING A COOLING MEDIUM

REFERENCES CITED

EP 111 827, Dec. 22, 1982, Hoenig.
DE 3 515 199, Apr. 26, 1985, Hoenig.
DE 3 515 237, Apr. 26, 1985, Hoenig.
EP 361 137, Sep. 16, 1988, Hoenig.
R. Hari and R. J. Ilmoniemi, "Cerebral Magnetic Fields", CRC Critical Reviews in Biomedical Engineering, vol. 14 (1986), issue 2, pp. 93-126. T. Ryhänen, H. Seppä, R. Ilmoniemi, and J. Knuutila, "SQUID Magnetometers for Low-Frequency Applications", Journal of Low Temperature Physics, vol. 76 (1989), issue 5/6, pp. 287-386.
J. Knuutila, S. Ahlfors, A. Ahonen, J. Hällström, M. Kajola, O. V. Lounasmaa, C. Tesche, and V. Vilkman, "A Large-Area Low-Noise Seven-Channel DC SQUID Magnetometer for Brain Research", Review of Scientific Instruments, vol. 58 (1987), issue 11, pp. 2145-2156
F. Wellstood, C. Heiden and J. Clarke, "Integrated Dc SQUID Magnetometer with a High Slew Rate", Review of Scientific Instruments, vol. 55 (1984), issue 6, pp. 952-957
J. Knuutila, A. I. Ahonen, M. S. Hämäläinen, R. J. Ilmoniemi, and M. J. Kajola, "Design Considerations for Multichannel SQUID Magnetometers", Superconducting Quantum Interference Devices and Their Applications SQUID'85, de Gruyter, Berlin 1985, pp. 939-944
D. Drung, R. Cantor, M. Peters, H. J. Scheer, and H. Koch, "Low-Noise High-Speed Dc Superconducting Quantum Interference Device Magnetometer with Simplified Feedback Electronics", Applied Physics Letters vol. 57 (1990), issue 4, pp. 406-408

BACKGROUND OF THE INVENTION

1. Field of the Invention

This invention relates to a device that measures the weak magnetic fields, both space and time dependent, which are generated by a source inside an object to be investigated. Such instruments are employed to detect magnetic fields elicited especially by the neural functions; the method is gaining gradually a more important role in medical diagnostics and research. In particular, it is possible to investigate the brain functions and disorders in a human being without touching the person or exposing him to electromagnetic radiation or radioactive tracers. In contrast to the widely used electroencephalogram (EEG), in which the electric potential distribution is measured on the surface of the scalp, the magnetoencephalogram suffers far less from distortions caused by inhomogeneities in the conductivity of the human tissue. Therefore, it is possible to locate source currents related to brain activity with a spatial and temporal resolution of a few millimeters and milliseconds. The method has been reviewed in detail, for example, in CRC Critical Reviews in Biomedical Engineering, volume 14 (1986), issue 2, pp. 93-126. Instruments used in MEG should be able to detect magnetic signals whose magnetic flux density is typically 100 fT or less. In addition, the measurement is to be performed simultaneously at several locations; the measurement of even more than one hundred magnetic signals from all over the head is necessary. The only sensor capable of detecting these minute signals is the so-called Superconducting Quantum Interference Device (SQUID) magnetometer. The operation of the device has been explained in detail in an article in Journal of Low Temperature Physics, volume 76 (1989), issue 5/6, pp. 287-386. The device requires a low operating temperature. Commonly, it is in a liquid helium bath inside a vacuum-insulated dewar vessel; the temperature is then 4.2K.

This invention focuses especially on the insert inside the dewar vessel; the SQUID magnetometer elements are attached to this insert. The insert must be stable enough and it must withstand tensions and changes in dimensions caused by the differential thermal contraction of various materials while cooling the device down to its operating temperature. At the same time, also the heat leak from room temperature to the helium bath must be minimized. The latter fact is of particular importance, because the device intended for measurements on a wide area necessarily has a large cross-section. The neck of the dewar needed for such a device must be wide; thus the heat leak by conduction, convection and radiation through the neck can substantially increase the helium boil-off rate and thus shorten the duty cycle between maintenance operations.

2. Description of the Related Art

A well-known prior-art structure of an insert (see, e.g. Review of Scientific Instruments, vol. 58 (1987), issue 11, pp. 2145-2156) consists of a fiber glass tube body, to which the metallic radiation shield baffles are attached in the neck region. In the lower end of the tube there is a holder to which the individual magnetometers or gradiometers are attached. All magnetometers or gradiometers can be on a same substrate as well, as has been presented in EP 111 827. The latter solution has, however, the drawback that all sensors must be in a common plane; thus it is not possible to adapt the device to the shape of the person to be investigated, as is possible when using individual sensor elements.

The electronic components which must be kept at liquid helium temperature are soldered on a printed circuit board attached to the tube body, and the wirings from the top plate connectors at room temperature are routed to liquid helium space inside copper-nickel tubes. The structure has, however, several drawbacks. The whole unit consists of one single component which is tedious and expensive to assemble and maintain. Especially in dewar vessels with wide-area necks a large space is left between the radiation baffles; the heat convects partially between two baffles because of the turbulence of the outflowing helium gas. Therefore, the temperature distribution tends to equalize in the vertical direction, increasing the boil-off rate unnecessarily. A neck plug made of foam plastic, attached to the tube body, has also been employed to circumvent the latter problem.

In another known solution (see DE 3 515 199) the body of the magnetometer has been divided into two parts. The so-called flux transformer coils of the magnetometer are in a fixed holder on the bottom of the dewar; this holder is then connected, via a multi-contact superconducting connector to a module that contains a group of SQUIDs, all inside a single element, a neck part and an electronics unit. The neck part contains all the necessary cabling and the thermal radiation shields; the electronics unit forms also the top plate for the dewar. In this construction, the holder with the flux transformers has been assembled already during the fabrication of the dewar vessel and can not be removed from the dewar via the neck made small to minimize the heat leak. As drawbacks one may mention that it is impossible to change or repair the flux transformers afterwards and that it is very difficult to make reliable multi-contact superconducting connectors. One may not that although the need for such connectors has existed, in different circumstances, already for twenty years no such connectors have been made in practice. The gradiometer holder has been fixed firmly and rigidly to the dewar bottom; in addition the module with the SQUID group, the neck plug, and the electronics unit is of rigid construction (column 4, lines 2–10). Therefore, when cooling the device down to its operating temperature, dangerously large tensions and stresses may be generated because of differential thermal contraction of various materials; these stresses may break the structure.

The radiation shields in the neck have in DE 3 515 199 been realized in an conventional way (see FIG. 4). Then, the convection problem between two successive baffles occurs. In addition, the module containing the SQUID group, the neck with cables and the electronics unit form a single piece which is difficult to disassemble for eventual maintenance. Furthermore, the referred publications do not present any solution to the problem that arises when there are very many channels, on the order of 100: the cabling in the neck easily dominates the heat leak. This problem can be circumvented by choosing the conductor material to be very resistive, but then, the noise of the sensors will increase in intolerably if conventional read-out methods are used.

The DE 3 515 199 also discusses the possibility of making the cabling by patterning a flexible printed circuit board. This solution, although very elegant and efficient in the manufacturing point of view, has a drawback: the conductor materials on standard printed circuit boards have high conductance and a resistive material to reduce heat leak cannot be chosen freely. It is also impossible to twist the wires to increase the immunity to interference magnetic fields and cross-talk between the channels.

DE 3 515 237 deals with a similar array of gradiometers as DE 3 515 199; in particular, the SQUID group, which has been integrated as a single module on a common substrate, and its internal structure are discussed. Specific attention is paid to the arrangement of wirings via groundplanes and to the magnetic shielding of the SQUIDs by means of superconducting loops and groundplanes. In this aforementioned application, the SQUID chip has been attached to a printed circuit board, onto which the conductors have been patterned. Also, the electronics unit forms the top plate of the dewar vessel (see FIG. 1). Furthermore, the assembly of flux transformers and the SQUID group have been connected in a way that can be easily disconnected, for example via a multi-contact superconducting connector. The drawbacks of this construction are mainly the same as in the first referred publication. In particular, the problems are enhanced when the number of channels in large, on the order of one hundred of more. A complete modularity that is necessary for reliability, easy testability and ease of manufacture is not reached, completely reliable superconducting multicontact connectors are difficult if not impossible to manufacture, and if one SQUID fails, the complete group of SQUIDs has to be changed. In addition, the heat leak problem has not been solved by the conventional wiring and radiation shield structures utilized in the referred publication. Neither has the differential thermal contraction been taken into account.

EP 361 137 discusses a magnetometer that can be positioned in an unconventional way, upside down so that the gradiometer coils are topmost. Liquid helium is inside a separate vessel inside the dewar; the cold helium gas boiling off this inner vessel is led, via tubes, to cool the gradiometer coils. The SQUID group is inside a separate unit in the liquid helium container. The neck of the dewar is substantially narrower than the gradiometer part; thus, most parts have to be assembled in place when the dewar is being made. To prevent counterflow of warm helium gas from outside to inside, a special constriction with relief flaps has been constructed in the neck. The basic idea of this device is significantly different from what is aimed at in our invention; thus, for example the neck is of completely different structure, and the whole structure is not modular in the sense of what would be desired. When the number of channels approaches one hundred, it is reasonable to assume that an even and reliable cooling of the gradiometer coils cannot be accomplished with a moderate liquid helium consumption. To maintain such an instrument with many fixed parts inside the dewar would also be difficult.

In a conventional read-out of SQUIDs the heat conduction through the cables in the neck can be dominating, when the number of channels is large. To minimize noise, the resistance of the wires connected to the SQUIDs has traditionally been kept as small as possible. Because of the Wiedemann-Franz' law, a large heat leak follows necessarily. For example, a resistance of 1 $\Omega$ in a wire leading from room temperature to liquid helium gives rise to a thermal load of 2 mW, if the cooling due to the outflowing helium gas is neglected and the change of resistivity of the wire as a function of temperature is negligible. In a hundred-channel instrument, where six conductors per channel are required, this means a boil-off rate of 1. 7 liters/hour; this is approximately ten times too high for a practical device.

SUMMARY OF THE INVENTION

With the present invention, a substantial improvement to the prior art is gained. The features characteristic to this invention are as follows. The body of the instrument has been subdivided into separate modules that are easily disconnected and assembled; these modules have been attached to each other by means of commercially available connectors. Especially the neck plug of the insert is made of stiff thermal radiation insulation, which also effectively prevents backward convection, and of ribbon cable made of parallel twisted pairs of resistive wire; they make up a single piece that acts as a support structure.

The invention has several advantages. Especially the neck plug is of solid and light construction, a good thermal insulator but at the same time, constructionally simple. The plug-like structure prevent effectively the turbulent convection between the radiation shield baffles, and the thermal conductivity of the foam plastic used is small. The foam plastic plug can be thought as a continuous stack of radiation shield baffles; the emissivity as compared to conventional metallic baffles is poor, though, but this drawback is effectively compensated by the large number of the "equivalent floating baffles". To equalize the lateral temperature distribution inside the plug, metallic plates inside the foam plastic can be used. By making the gap between the neck of the dewar and the radiation shield plug narrow enough, the cooling by the outflowing cold helium gas can be effectively utilized. Especially, if the cables are placed against the outer wall of the neck plug, a good thermal contact with the outflowing gas is reached, and the amount of heat conducted via the cables is reduced. This heat leak can be made completely negligible by choosing a conductor material of high resistivity. However, because the thermal noise of the sensors increases as well, this solution cannot be used as such. Here, the problem has been solved by compensating the excess noise, for example by increasing the SQUID gain be means of positive feedback. The use of positive feedback as such to increase the signal-to-noise ratio of the SQUID-preamplifier combination is known previously (see, for example *Applied Physics Letters* vol. 57 (1990), issue 4, pp. 406-408). Because the resistive conductor is a poor conductor of heat, spare cables can also be placed in the neck; broken leads can then be easily repaired by taking one of the spare leads into use. The fabrication of the leads can be accomplished by using prefabricated twisted pair conductor which is laminated as a sheet with a well-known, so-called coil-foil method.

Because of the insert neck construction characteristic to this invention, the dewar neck can be made wide enough: the whole insert can easily be removed from the dewar for maintenance. Because of modularity, manufacturing, transport, and maintenance is easy; even industrial production of spare parts is feasible. A special benefit of this structure is that all modules can be separately tested before final assembly. Elastic support of the insert, leaning on the bottom and the walls of the dewar insures that tensions and stresses generated by differential thermal contraction do not break the structure and that the insert settles in a well-defined place and position inside the dewar.

Since this invention makes use of integrated elements containing both the SQUIDs and magnetometer or pickup coils (see, for example, *Review of Scientific Instruments*, vol. 55 (1984), issue 6, pp. 952-957 or *Superconducting Quantum Interference Devices and Their Applications SQUID'85*, de Gruyter, Berlin 1985, pp. 939-944), no superconducting detachable connections are required in the insert structure. Connection between the various modules can therefore be realized by conventional multicontact connectors widely available commercially.

DETAILED DESCRIPTION

Figure 1:
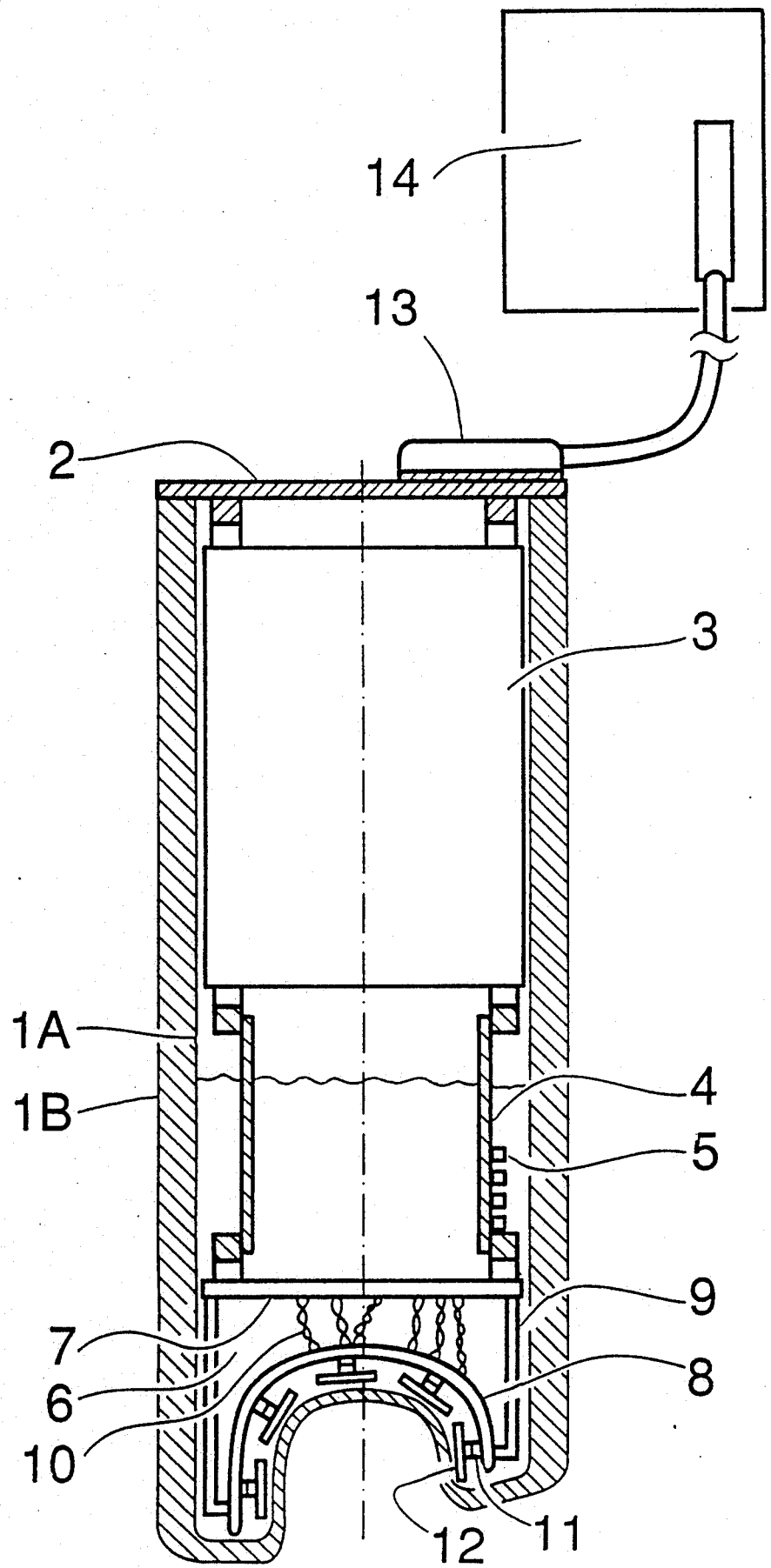
FIG. 1 shows schematically the structure of the magnetometer, including the dewar vessel.

In the following, a preferred embodiment of the invention is presented. According to FIG. 1, the magnetometer proper is inside a dewar, consisting of an inner vessel (1A) and an outer vessel (1B); the vacuum space between the shells contains also radiation shields which are not shown in the figure. The main parts of the magnetometer are: a top plate (2) made of multilayer printed circuit board, functioning also as a motherboard, neck plug (3) made of foam plastic, functioning also as a electrical connecting element (cable), connecting elements (4) inside liquid helium, a cross-connection element (6) and sensor elements (12).

The SQUIDs and flux transformers employed to measure the magnetic field or its gradients are inside separate and independent components, the sensor elements (12) of which are then connected to the magnetometer body with connectors. Each sensor element (12) can also contain several SQUIDs with their flux transformers. The lowest part of the magnetometer insert is a support shell (8) following the shape of the dewar bottom; connectors (11) to which the sensor elements (12) are attached reside on this shell. The dewar bottom has been adapted to the shape of the head. The support shell (8) is attached via one mechanical connecting element or via several mechanical connecting elements (9) to a printed circuit board (motherboard) (7); the connectors (11) are wired to this motherboard using, for example, twisted pairs (10). A detailed construction and the means to attach them has been shown in a co-pending application "Compact magnetometer probe and an array of them covering the whole human skull for measurement of magnetic fields arising from the activity of the brain" by Ahonen, Knuutila, Simola, and Vilkman, Ser. No. 07/807,122, filed Dec. 13, 1991. The motherboard (7), connecting element(s) (9), support shell (8), the connectors (11) and the wiring (10) form a unit (6) which can separately assembled and tested. The motherboard (7) has also connectors to which the rectangular-shaped support/electrical connector parts (4) made of printed circuit board are attached. The electric components (5), necessary for connecting the SQUIDs to electronics at room temperature, reside also on the printed circuit boards (4) and (7). The printed circuit boards are connected to the uppermost part of the insert, a motherboard (2) functioning also as a top plate of the dewar, via a radiation shield-/cabling unit (neck plug) containing at both ends electrical connectors fitting to the connectors on the top plate (2) and the connector parts (4). If necessary, the mechanical support by the connectors between the various units (2, 3, 4, 6) can be secured by using, for example screws. On top of the motherboard (2) there are connectors onto which the cables leading to the electronics unit (14) are attached. Because of the special read-out technique, it is not necessary to place the electronics unit close to the SQUIDs as possible, i.e. on top the dewar.

Figure 2:
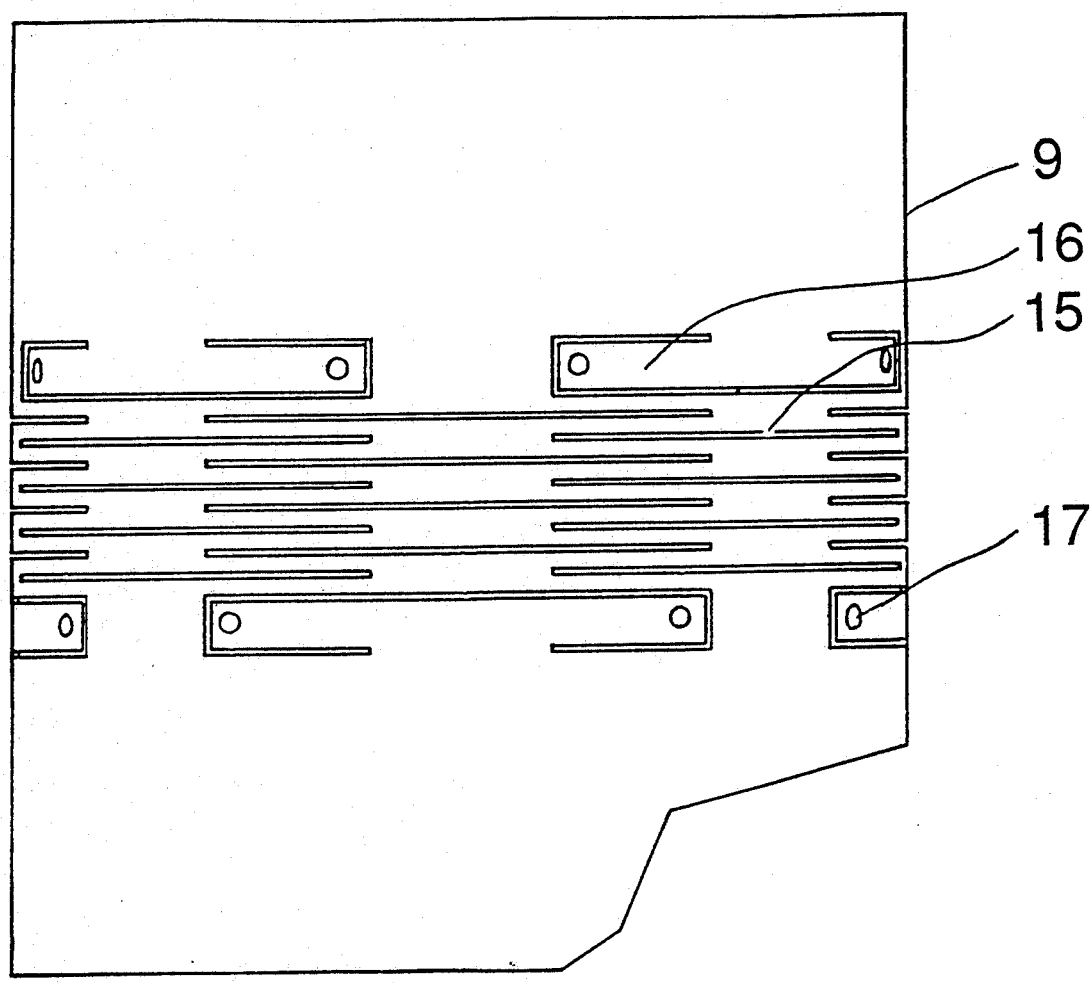
FIG. 2 is a side view of a support structure employed in the present invention.

A preferred embodiment for the connecting element (9) has been shown in FIG. 2. The element (9) consists of a thin cylindrical fiber glass tube whose lower end has been cut to fit the support structure (8) following the shape of the head. The tube (9) has several transverse cuts (15); because of these, the connection of the support shell (8) is flexible, compensating possible stresses caused by different thermal contractions of the materials. The spring action created by the cuts (15) in the axial direction also presses the support shell (8) against the dewar bottom. To center the magnetometer insert with respect to the dewar and to support the insert in lateral direction against the dewar walls the tube (9) can also contain tongue-shaped springs cut in the tube (16), having small elevations (17) made of a easily gliding material, for example Nylon TM of Teflon TM. The spring presses, in the radial direction, the elevations (17) against the dewar wall.

Figure 3A:
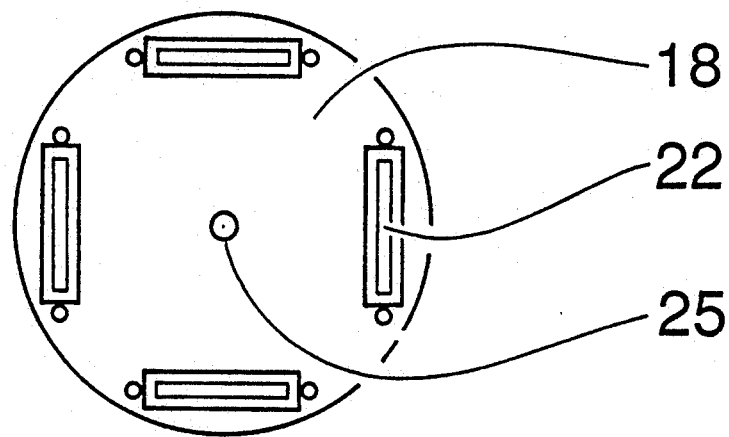
FIG. 3A is a top view of a neck plug employed in the present invention.
Figure 3B:
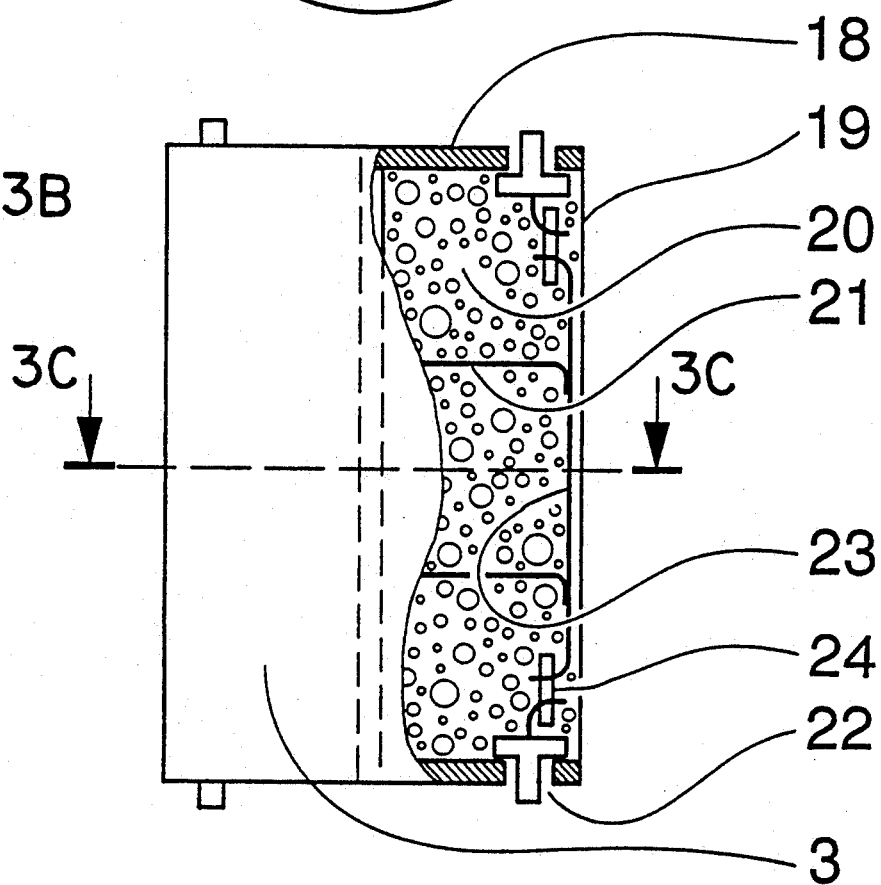
FIG. 3B is a partially broken away side view of the neck plug.
Figure 3C:
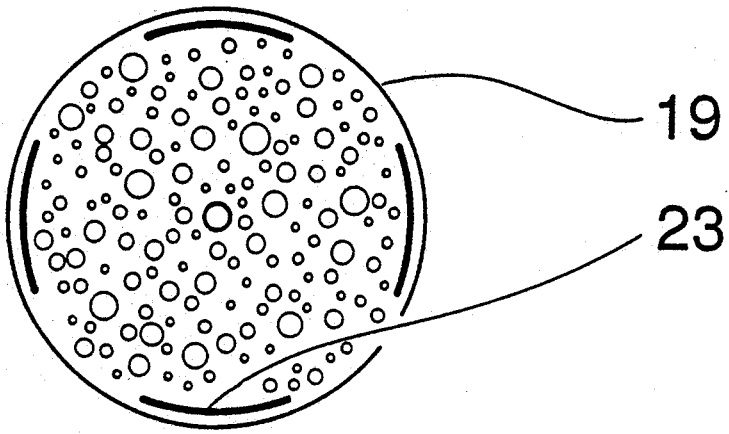
FIG. 3C is a cross sectional view of the neck plug taken along the line C—C of FIG. 3B.

The neck plug (3) is shown in FIG. 3. This part acts as a radiation shield plug and a cable between the room temperature electronics and the parts at liquid helium; in addition, it guides the outflow of the helium gas. A cylindrical plug is filled with foam plastic (20), for example polyurethane. The ends (18) of this cylinder have been made of glass fiber plate, and they contain openings for electrical connectors (22) and for a tube (25) necessary to transfer helium. The outer surface of the plug has been laminated with a thin fiber glass layer (19), firmly attached to the foam plastic. The flat ribbon cables (23) have been attached, for example, using small printed circuit boards (24) to connectors (22) and laminated between the foam plastic (20) and the fiber glass layer (19). Inside the foam plastic there are some metallic plates (21) parallel to the end plates. The plates (21) can be made, for example out of copper mesh or printed circuit board, and they guarantee an even temperature distribution inside the foam plastic.

Figure 4A:
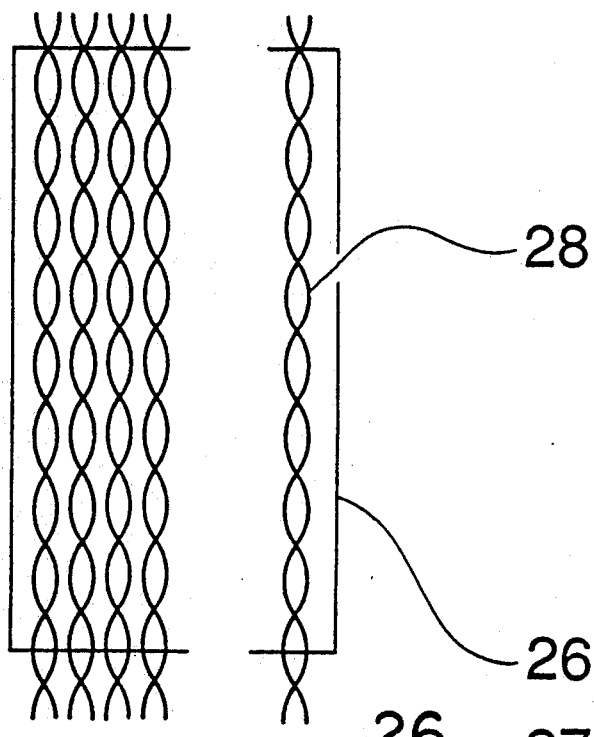
FIG. 4A is an elevational view of a cable component of the neck plug.
Figure 4B:
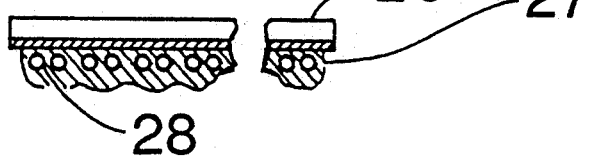
FIG. 4B is a cross sectional view taken along the line B—B of FIG. 4A.

The structure of the flat ribbon cables (23) has been shown in FIG. 4. A metallized plastic film or paper (26) is placed on a drum, and prefabricated insulated twisted pair cable (28) is wound on the metallized surface. The coil is impregnated with epoxy resin (27), and after polymerization of the epoxy the cable is removed from the drum, connected to the connectors (22) in FIG. 3, and the metallized film or paper (26) is grounded using the connector (22) in order to shield against capacitively coupled disturbances.

We claim:

1. A SQUID magnetic flux detecting device for sensing weak magnetic fields generated by a source inside an object, said device comprising:

a vessel formed of a wall member, said wall member having an opening into the interior of said vessel and a neck part adjacent to and surrounding said opening, a portion of said wall member being shaped to be placed in contiguity with the object, the interior of said vessel containing an evaporatable cooling medium;

a sensing means (6) positioned in said vessel and comprising a plurality of SQUID sensor elements (12), each of said sensor elements being formed as an integrated element containing both a SQUID and a magnetometer coil and having at least one measurement channel, said sensing means further including support means (8) for mounting said sensor elements and for positioning same into a spatial configuration that corresponds to the shape of said wall portion, said sensing means having first disconnectable and reconnectable electrical connectors;

a neck plug (3) formed of a thermal insulating material having means embedded therein for laterally equalizing temperature distribution within said plug, said neck plug having electrical conductors extending therethrough, the resistance properties of said conductors being such as to minimize heat leaks through said neck plug, said neck plug having second disconnectable and reconnectable electrical connectors connected to the ends of said conductors, said neck plug being positioned within the neck part of said vessel and above the cooling medium for substantially occupying said neck part of said vessel to lessen heat transfer and evaporative loss of said cooling medium through said neck part and to direct evaporating cooling medium onto the surface of said neck part to enhance the cooling of said neck part; and a connecting element means (4) having circuitry for said SQUID sensor elements, said connecting element means being located in said vessel and interposed between said sensing means and said neck plug, said connecting element means having third and fourth disconnectable and reconnectable electrical connectors connected to said first and second electrical connectors, respectively, to form the sensing means, neck plug, and connecting element means into an integral, unitary, self supporting structure;

the sensing means, neck plug, and connection element means of said device being formed such that they can be inserted, as said integral unitary structure, into said vessel through said opening and neck part to rest on the wall member of said vessel with said SQUID sensor elements contiguous to said wall member portion, said sensing means, neck plug and connection element means being removable from said vessel through said neck part and opening for disassembly at said disconnectable and reconnectable connectors.

2. A device according to claim 1 further defined in that said sensing means rests against said wall member portion of said vessel when said device is inserted in said vessel.

3. A device according to claim 1 wherein, in said sensing means, said support means has the shape of said wall member portion of said vessel, and wherein said sensing means includes a printed circuit board and a support element for coupling said support means to said printed circuit board, said printed circuit board having said first disconnectable and reconnectable electrical connectors.

4. A device according to claim 3 wherein said support element is a tubular element having a plurality of cuts extending along portions of the circumference of the element to provide elasticity to said element in the axial direction of said element.

5. A device according to claim 4 wherein said support element has portions which can flex in a generally radial direction with respect to said element, said portions supporting said element against the wall member of said vessel.

6. A device according to claim 1 wherein said neck plug is formed of foamed plastic material.

7. A device according to claim 1 wherein, in said neck plug said electrical conductors are located near the exterior of said plug so as to be cooled by evaporating coolant.

8. A device according to claim 1 wherein said electrical conductors of said neck plug are formed of ribbon-like substrates having twisted pairs of wires affixed thereto.

9. A device according to claim 8 wherein said ribbon-like substrates have metal foil shields.

10. A device according to claim 1 further including a plate (2) spanning the opening of said vessel, said plate being connectable to said electrical conductors of said neck plug and to external signal processing circuitry for said device.

* * * * *

UNITED STATES PATENT AND TRADEMARK OFFICE
CERTIFICATE OF CORRECTION

PATENT NO. : 5,243,281
DATED : September 7, 1993
INVENTOR(S) : Ahonen et al

It is certified that error appears in the above-indentified patent and that said Letters Patent is hereby corrected as shown below:

On the title page, item (54) and column 1:

After the word "MAGNETOMETER" insert ---OF---

Signed and Sealed this

Twenty-sixth Day of April, 1994

Attest:

BRUCE LEHMAN

Attesting Officer     Commissioner of Patents and Trademarks